United States Patent [19]

Ozawa et al.

[11] 3,761,775

[45] Sept. 25, 1973

[54] PROTECTIVE CIRCUIT

[75] Inventors: Akio Ozawa, Tokyo; Seijiro Fujie, Yokohama, both of Japan

[73] Assignee: Pioneer Electronic Corporation, Tokyo, Japan

[22] Filed: Nov. 16, 1971

[21] Appl. No.: 199,207

[30] Foreign Application Priority Data

Nov. 16, 1970 Japan ..... 45/113492 (utility model)

[52] U.S. Cl. ........... 317/27 R, 317/33 R, 330/207 P

[51] Int. Cl. ........................... H02h 3/28, H02h 7/20

[58] Field of Search ................ 330/207 P, 51, 30 D; 307/202, 235; 317/27 R, 33 R, 33 X, 33 SC, 12 R, 12 A, 12 B; 323/DIG. 1; 340/248 A, 248 E, 248 F, 253 A, 253 H, 253 N

[56] References Cited

UNITED STATES PATENTS

| | | | |
|---|---|---|---|
| 3,250,981 | 5/1966 | Marks | 317/33 X |
| 3,219,911 | 11/1965 | Burfeindt | 307/202 |
| 3,497,794 | 2/1970 | Frederickson et al. | 323/DIG. 1 |
| 3,058,036 | 10/1962 | Reuther | 317/33 X |
| 3,486,128 | 12/1969 | Lohrman | 330/30 D |
| 3,550,025 | 12/1970 | Stodolsky | 330/51 |

*Primary Examiner*—J. D. Miller
*Assistant Examiner*—Harvey Fendelman
*Attorney*—Richard C. Sughrue et al.

[57] ABSTRACT

A protective circuit for protecting an output circuit and a load circuit of a signal amplifier from abnormal conditions and including a differential amplifier for detecting the abnormal conditions of the output circuit and the load circuit. The circuit is particularly useful for protection of an output-condenser-less amplifier.

3 Claims, 1 Drawing Figure

PATENTED SEP 25 1973 3,761,775
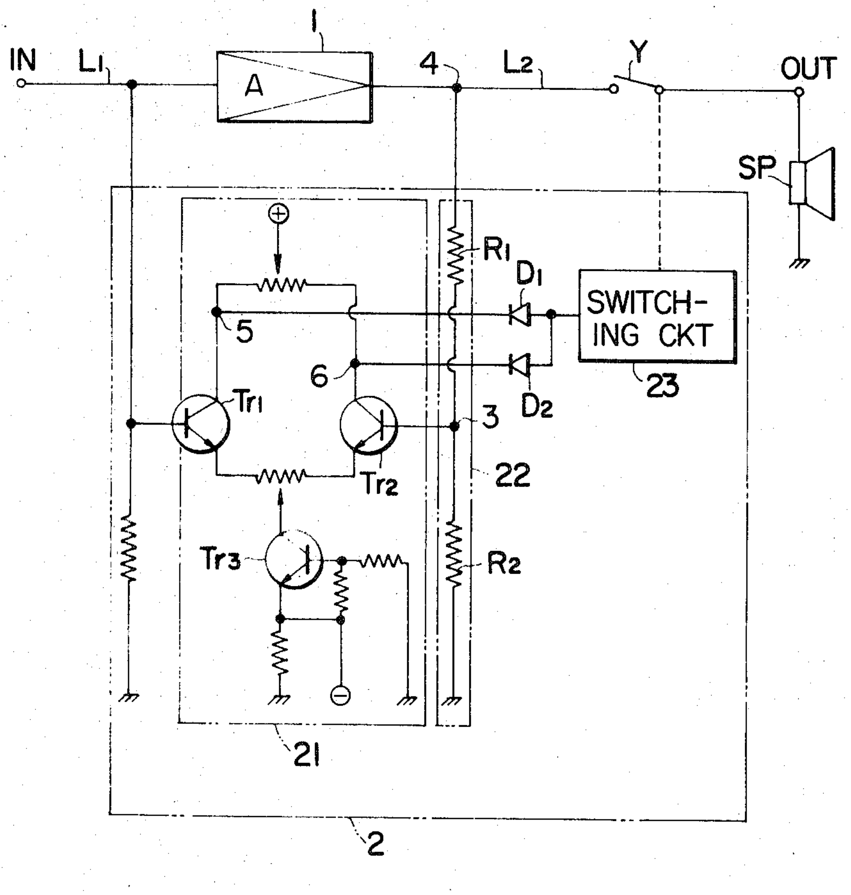
INVENTORS
AKIO OZAWA
SEIJIRO FUJIE
BY Sughrue, Rothwell, Mion, Zinn & Macpeak
ATTORNEYS

PROTECTIVE CIRCUIT

BACKGROUND OF THE INVENTION

1. Field of the Invention

This invention relates to a protective circuit for protecting an output circuit and/or a load circuit from abnormal conditions, and, more particularly, to a protective circuit useful for an output-condenser-less (O.C.L.) amplifier.

2. Description of the Prior Art

In the prior art, most of the audio amplifiers have been an output-transformer-less (O.T.L.) amplifier. However, since such an amplifier having a better performance has been urgently needed, it has been recognized that the output condenser of an O.T.L. amplifier adversely affects the output signal. An O.T.L. amplifier without an output condenser and having two power sources is called an output-condenser-less (O.C.L.) amplifier and has received notice recently.

In this O.C.L. amplifier, an output terminal is directly connected to a load circuit rather than through an output condenser. Consequently, when the D.C. voltage level of the output signal line varies, a direct current in accordance with the variation of the D.C. voltage flows into the load circuit. As a result, the load circuit, such as a loudspeaker, etc., is broken down by the direct current at times. On the other hand, active electrical devices in the output stage, for example, output transistors are broken down in the event of a short in the load circuit at times. Consequently, the O.C.L. amplifier requires greater care than the O.T.L. amplifier having the output condenser in respect of providing protection for the amplifier and its load circuit.

SUMMARY OF THE INVENTION

The present invention cures the afore-mentioned defects in O.C.L. amplifiers.

A primary object of the invention is to provide a protective circuit for surely protecting an output circuit and/or a load circuit from abnormal conditions, such as an excessive input or output signal, a short in the load circuit, or a variation of a D.C. voltage in the circuits.

A more specific object of the invention is to provide a protective circuit for an O.C.L. amplifier.

Other objects, advantages and features of the present invention will become apparent from the following description taken in conjunction with the accompanying drawing.

BRIEF DESCRIPTION OF THE DRAWING

The single FIGURE is a circuit diagram showing one embodiment of a protective circuit in accordance with the present invention.

DESCRIPTION OF THE PREFERRED EMBODIMENT

One embodiment of this invention will be explained in accordance with the drawing.

An output-condenser-less (O.C.L.) amplifier 1 has two power sources, that is, a positive power source (+) and a negative power source (−). An input terminal IN and an output terminal OUT are connected to the O.C.L. amplifier 1 via an input-signal line L1 and an output-signal line L2, respectively. These signal lines L1 and L2 are normally at ground potential with respect to a direct current. In this embodiment, the input signal and the output signal of the O.C.L. amplifier 1 are in phase with each other. A loudspeaker SP is connected between the output terminal OUT and ground.

A protective circuit 2 for the amplifier 1 and the loudspeaker SP consists of a differential amplifier 21, an attenuator 22, a switching circuit 23, and a switch contact *y*. The differential amplifier 21 includes transistors Tr1, Tr2 and Tr3. The base electrodes of the transistors Tr1 and Tr2 are connected to the input-signal line L1 and to an output terminal 3 of the attenuator 22, respectively. The transistor Tr3 functions as a constant current circuit. Both the transistors Tr1 and Tr2 are normally in balanced states. The attenuator 22 has an attenuation factor of the same magnitude as the amplification factor of the amplifier 1. An input terminal 4 and the output terminal 3 of the attenuator are connected to the output signal line L2 and the base electrode of the transistor Tr2, respectively. In this embodiment, the attenuator 22 is formed by resistors R1 and R2. The switching circuit 23 is connected to output terminals 5 and 6 of the differential amplifier 21 via diodes D1 and D2, and, when operated, opens the switch contact *y* in the output signal line L2 when either output voltage of the differential amplifier 21 becomes lower than a predtermined voltage. In addition, the switching circuit 23 is designed to hold the contact *y* in the opened state for a few seconds after the contact *y* has been opened.

Next, the operation of the protective circuit will be explained. Normally, the base electrodes of the transistor Tr1 and Tr2 are at ground potential, the differential amplifier 21 is in a balanced state, and the switching circuit 23 is not operated, whereby contact *y* is closed.

In this state, when a signal is applied to the input terminal IN, part of the signal is applied to the O.C.L. amplifier 1 and another part of the signal is applied to the base electrode of the transistor Tr1 in the differential amplifier 2. The signal applied to the amplifier 1 is amplified with a settled amplification factor; some part of the amplified signal drives the loudspeaker SP via the contact *y*, and another part of the amplified signal is applied to the attenuator 22. The applied signal is attenuated by the attenuation factor of the same magnitude as the amplification factor of the amplifier 1, and the attenuated signal is applied to the base electrode of the transistor Tr2. Since both the signals fed to the bases of the transistors Tr1 and Tr2 have the same phase and magnitude, the differential amplifier 21 remains in the balanced state.

On the other hand, when the D.C. potential of the output signal line L2 varies due to some disorder of the amplifier 1, the base voltage of the transistor Tr2 varies in accordance with the variation of the D.C. potential of the output signal line L2. Consequently, the differential amplifier 21 goes into an unbalanced state to produce an output signal which operates the switching circuit 23. By the operation of the switching circuit 23, the contact *y* is opened, and the load circuit, that is, the loudspeaker SP, is protected from the disorder of the amplifier 1.

Moreover, when the terminals of the loudspeaker are short-circuited due to some cause, A.C. signals do not appear on the output signal line L2. Consequently, the differential amplifier 21 goes into an unbalanced state; as described above, the switching circuit 23 is operated to open the contact *y*, and the amplifier is protected securely from the disorder of the load circuit. In addition, when the switching circuit 23 is operated, it returns to its original unoperated state after a few seconds so that the contact $y$ is closed again. At this time, if the differential amplifier 21 remains still in the unbalanced state, the contact $y$ is opened again; consequently, the amplifier 1 or loudspeaker SP is protected securely from some disorder again.

Also, when an excessive input signal occurs on input terminal IN such that the output signal would be clipped, the differential amplifier 21 again goes into the unbalanced state, and the protective circuit 2 operates as already described. Consequently, a listener will recognize that an exorbitant input signal is being applied to the input terminal and will adjust the input signal level to get a normal output signal.

In the one embodiment described above, the attenuator having the attenuation factor of the same magnitude as the amplification factor of the amplifier 1 is used to balance the input voltages at both of the input terminals of the differential amplifier 1. However, this invention is not limited to this embodiment alone.

Another object of this invention is broadly to protect the amplifier or the load by using the output of the differential amplifier. This invention is not limited at all as to the way in which the output is used. That is, the control circuit is not limited by this example, but may be a well-known circuit which is operated by the output of an abnormal condition detecting circuit to protect the amplifier or the load. For example, the source may be opened by the controlling circuit and the contact $y$ is not necessarily required.

The protective circuit according to the present invention, as set forth above, is a circuit operated when a differential amplifier turns into the unbalanced state due to some disorders, consequently, an amplifier and/or a load circuit is protected securely from an overload and/or from a variation of the D.C. voltage of the amplifier.

While the invention has been particularly described and shown with reference to the preferred embodiment thereof, it will be understood by those skilled in the art that various changes in form and details may be made therein without departing from the spirit and scope of the invention.

We claim:

1. A protective circuit for protecting an output stage of a signal amplifier comprising:

*a.* a normally balanced differential amplifier having a first input connected to the input, and a second input coupled to the output, of said signal amplifier, said differential amplifier being responsive to an abnormal condition of said signal amplifier to go into an unbalanced state to produce a control signal at its output,

*b.* normally unoperated switching means connected to the output of said differential amplifier and operative to protect the output stage of said signal amplifier from abnormal conditions, said switching means being operated by said control signal when said differential amplifier goes into an unbalanced state, and

*c.* an attenuation circuit having an input connected to said output of said signal amplifier and having an output connected to said second input of said differential amplifier, said attenuation circuit having an attenuation factor of the same magnitude as the amplification factor of said signal amplifier.

2. A protective circuit as set forth in claim 1, wherein said switching means comprises a switching circuit having a switch contact in the output of said signal amplifier.

3. A protective circuit as set forth in claim 1, wherein said signal amplifier is an output-condenser-less amplifier.

* * * * *